(12) United States Patent
Huang

(10) Patent No.: US 11,765,942 B2
(45) Date of Patent: Sep. 19, 2023

(54) DISPLAY DEVICE AND MANUFACTURING METHOD OF DISPLAY DEVICE

(71) Applicant: TCL China Star Optoelectronics Technology Co., Ltd., Guangdong (CN)

(72) Inventor: Hui Huang, Guangdong (CN)

(73) Assignee: TCL China Star Optoelectronics Technology Co., Ltd., Guangdong (CN)

( * ) Notice: Subject to any disclaimer, the term of this patent is extended or adjusted under 35 U.S.C. 154(b) by 449 days.

(21) Appl. No.: 16/972,766

(22) PCT Filed: Oct. 30, 2020

(86) PCT No.: PCT/CN2020/125113
§ 371 (c)(1),
(2) Date: Dec. 7, 2020

(87) PCT Pub. No.: WO2022/052251
PCT Pub. Date: Mar. 17, 2022

(65) Prior Publication Data
US 2022/0320200 A1 Oct. 6, 2022

(30) Foreign Application Priority Data
Sep. 9, 2020 (CN) .......................... 202010940366.2

(51) Int. Cl.
*H10K 59/122* (2023.01)
*H10K 71/00* (2023.01)
*C09D 7/40* (2018.01)
*C08K 3/08* (2006.01)
*C09D 141/00* (2006.01)
(Continued)

(52) U.S. Cl.
CPC ............. *H10K 59/122* (2023.02); *C08K 3/08* (2013.01); *C09D 7/67* (2018.01); *C09D 141/00* (2013.01); *C09D 181/08* (2013.01); *H10K 71/00* (2023.02); *H10K 71/135* (2023.02); *B82Y 30/00* (2013.01); *B82Y 40/00* (2013.01); *C08K 2003/0806* (2013.01); *C08K 2003/0831* (2013.01); *C08K 2201/001* (2013.01); *H10K 59/1201* (2023.02); *H10K 2102/331* (2023.02)

(58) Field of Classification Search
None
See application file for complete search history.

(56) References Cited

U.S. PATENT DOCUMENTS

2006/0244369 A1 11/2006 Eiichi

FOREIGN PATENT DOCUMENTS

CN 1759344 A * 4/2006 ............. G02B 5/201
CN 107623074 A 1/2018
(Continued)

*Primary Examiner* — Michael Lebentritt
(74) *Attorney, Agent, or Firm* — PV IP PC; Wei Te Chung; Zhigang Ma

(57) ABSTRACT

A display device and a manufacturing method of the display device are provided. The display device includes a substrate; a pixel definition layer disposed on the substrate and having a plurality of pixel openings; a surface-active nanolayer disposed on a surface of the substrate and on a surface extending to the pixel definition layer, wherein the surface-active nanolayer covers a plurality of nanoparticles; and a light-emitting layer disposed in the plurality of pixel openings.

20 Claims, 3 Drawing Sheets

(51) Int. Cl.
*C09D 181/08* (2006.01)
*H10K 71/13* (2023.01)
*B82Y 30/00* (2011.01)
*B82Y 40/00* (2011.01)
*H10K 59/12* (2023.01)
*H10K 102/00* (2023.01)

(56) References Cited

FOREIGN PATENT DOCUMENTS

| | | | |
|---|---|---|---|
| CN | 108428719 A | 8/2018 | |
| CN | 110299388 A | 10/2019 | |
| CN | 110416280 A | 11/2019 | |
| JP | 2009192985 A | * 8/2009 | |
| JP | 2014013712 A | * 1/2014 | ......... H01L 27/3241 |

* cited by examiner

DISPLAY DEVICE AND MANUFACTURING METHOD OF DISPLAY DEVICE

BACKGROUND OF INVENTION

Field of Invention

The present disclosure relates to the field of display technology, and specifically to a display device and a manufacturing method of the display device.

Description of Prior Art

Organic light-emitting diode (OLED) displays have many advantages, such as being self-illuminous, having a low driving voltage, high luminous efficacy, short response time, high definition and contrast, wide viewing angles, wide temperature application range, being able to realize a flexible display and full color display with large area, etc. They are recognized as the most promising displays by the industry.

A mainstream direction for current OLED devices is an inkjet printing method, which mainly dissolves materials in solvents and makes them into ink, and then uses the inkjet printing method to print the ink drop by drop in specific regions. These regions are constrained by manufacturing a pixel definition layer (PDL) on a substrate. The pixel definition layer includes a plurality of walls. The plurality of walls form a plurality of openings. Each opening is the aforesaid specific region. However, some problems are present in current pixel definition layers. Because cross sections of the walls are regular trapezoids, after they are manufactured, certain angles are present between two lateral surfaces of the regular trapezoids and a surface of the substrate, which prevents the ink from completely diffusing in the pixels. After the ink is cured, ink droplets close to the lateral surfaces of the walls generate excessive contact angles, leading to greater thickness of droplets in the region and making thickness of ink droplets away from the lateral surfaces of the walls and close to middle of the openings relatively less. As such, droplets in one pixel unit to have problems of poor uniformity and uneven film thickness, finally resulting in low luminous efficacy. In a process of ink droplets diffusing, there is also a problem that a top surface of the ink is higher than top surfaces of the walls caused by the ink not being able to diffuse successfully, or a droplet cannot be dropped on the specific region but rather on edges of the walls. The pixel definition layer cannot block the ink between adjacent pixel units and in turn leads to connection forming on ink of adjacent pixel units, resulting in the ink in the adjacent pixel units mixing together and giving rise to a color blend phenomenon.

Uneven diffusion of ink in the pixel units is present in the display devices of the prior art, resulting in technical problems of poor uniformity of fluid levels in a same pixel unit, uneven lateral thicknesses, and the color blend phenomenon between adjacent pixel units.

SUMMARY OF INVENTION

Embodiments of the present disclosure provides a display device and a manufacturing method of the display device, configured to solve the technical problem that the uneven diffusion of the ink in the pixel units is present in the display devices of the prior art, resulting in technical problems of poor uniformity of fluid levels in a same pixel unit, uneven lateral thicknesses, and the color blend phenomenon between adjacent pixel units.

In order to solve the problems mentioned above, on a first aspect, the present disclosure provides a display device, including:
  a substrate;
  a pixel definition layer disposed on the substrate and having a plurality of pixel openings;
  a surface-active nanolayer disposed on a surface of the substrate and on a surface extending to the pixel definition layer, wherein the surface-active nanolayer covers a plurality of nanoparticles; and
  a light-emitting layer disposed in the plurality of pixel openings.

In some embodiments of the present disclosure, the surface-active nanolayer includes a plurality of discontinuous nanoparticles, a material of the nanoparticles includes a conductive metal or conductive macromolecules, and the conductive metal includes gold nanoparticles or silver nanoparticles.

In some embodiments of the present disclosure, a material of the surface-active nanolayer includes poly(3,4-ethylenedioxythiophene) and polystyrene sulfonate, a ratio of the poly(3,4-ethylenedioxythiophene) to the polystyrene sulfonate ranges from 1:5 to 8:1, and a mass fraction of the poly(3,4-ethylenedioxythiophene) ranges from 25% to 40%.

In some embodiments of the present disclosure, a maximum height of the nanoparticles is less than a thickness of the surface-active nanolayer.

In some embodiments of the present disclosure, a maximum height of the nanoparticles ranges from 20 nm to 50 nm, and a thickness of the surface-active nanolayer ranges from 20 nm to 80 nm.

In some embodiments of the present disclosure, an energy level of the surface-active nanolayer matches an energy level of the light-emitting layer.

In some embodiments of the present disclosure, a surface of the surface-active nanolayer away from the substrate is smooth.

In some embodiments of the present disclosure, a plurality of anodes are disposed on the surface of the substrate, the pixel definition layer includes a plurality of walls, and each of the walls is disposed between a gap of two adjacent anodes.

On a second aspect, the present disclosure provides a manufacturing method of the display device, the manufacturing method is configured to manufacture ant display device in the first aspect, including:
  providing a substrate; manufacturing a pixel definition layer on the substrate, wherein the pixel definition layer has a plurality of pixel openings;
  manufacturing a surface-active nanolayer on a surface of the substrate and a surface extending to the pixel definition layer, wherein the surface-active nanolayer covers a plurality of nanoparticles; and
  manufacturing a light-emitting layer in the plurality of pixel openings to obtain the display device.

In some embodiments of the present disclosure, a spin coating method, a coating method, a printing method, or an evaporation method is used for manufacturing the surface-active nanolayer, and the printing manner or the evaporation method is used for manufacturing the light-emitting layer.

In some embodiments of the present disclosure,
  manufacturing a first solution mixed with nanoparticles;

spin coating the first solution on the surface of the substrate and the surface extending to the pixel definition layer;

drying and baking the first solution to remove a solvent of the first solution to obtain the plurality of nanoparticles;

manufacturing a second solution mixed with a surface-active agent;

spin coating the second solution on the surface of the substrate and the surface extending to the pixel definition layer; and drying and baking the second solution to remove a solvent of the second solution to obtain the surface-active nanolayer, wherein the surface-active nanolayer covers the plurality of nanoparticles.

In some embodiments of the present disclosure, manufacturing the surface-active nanolayer includes:

manufacturing a third solution mixed with nanoparticles and a surface-active agent;

spin coating the third solution on the surface of the substrate and the surface extending to the pixel definition layer;

drying and baking the third solution to remove a solvent of the third solution to obtain the surface-active nanolayer, wherein the surface-active nanolayer covers the plurality of nanoparticles.

In some embodiments of the present disclosure, the surface-active nanolayer includes a plurality of discontinuous nanoparticles.

In some embodiments of the present disclosure, a material of manufacturing the nanoparticles includes a conductive metal or conductive macromolecules, and the conductive metal includes gold nanoparticles or silver nanoparticles.

In some embodiments of the present disclosure, a material of manufacturing the surface-active nanolayer includes poly(3,4-ethylenedioxythiophene) and polystyrene sulfonate, a ratio of the poly(3,4-ethylenedioxythiophene) to the polystyrene sulfonate ranges from 1:5 to 8:1, and a mass fraction of the poly(3,4-ethylenedioxythiophene) ranges from 25% to 40%.

In some embodiments of the present disclosure, a maximum height of the nanoparticles is less than a thickness of the surface-active nanolayer.

In some embodiments of the present disclosure, a maximum height of the nanoparticles ranges from 20 nm to 50 nm, and a thickness of the surface-active nanolayer ranges from 20 nm to 80 nm.

In some embodiments of the present disclosure, an energy level of a material of manufacturing the surface-active nanolayer matches an energy level of a material of manufacturing the light-emitting layer.

In some embodiments of the present disclosure, manufacturing the surface-active nanolayer comprises performing a planarizing process on a surface of the surface-active nanolayer away from the substrate.

In some embodiments of the present disclosure, the manufacturing method further includes manufacturing a plurality of anodes on the surface of the substrate, the pixel definition layer includes a plurality of walls, and each of the walls is disposed between a gap of two adjacent anodes.

In the present disclosure, by disposing the surface-active nanolayer covering the plurality of nanoparticles on the surface of the substrate and the surface extending to the pixel definition layer, when the light-emitting layer is inkjet printed, the ink firstly contacts to the nanoparticles while dropping, and contacting areas between the ink and the nanoparticles become small. The ink flows down along the nanoparticles dispersedly, and then diffuses evenly in the openings of the pixel definition layer. Therefore, the ink can cover on corner locations of bottom sections of the openings, and infiltration of the ink can be improved, thereby the color blend phenomenon between the adjacent pixel units being able to improve. Meanwhile, after the surface-active nanolayer is diffused, flatness of a top surface thereof is far flatter than the nanoparticles. The energy level of the surface-active nanolayer matches with the energy level of the light-emitting layer, which further improves uniformity of the light-emitting layer, and electrons and electron holes being trapped in advance and being not able to reach the light-emitting layer to emit light incurred by unevenness on the top surfaces of the nanoparticles is prevented. Also, difficulty of transmission on electron hole carriers and electron carriers incurred by inconsistency of the energy level of the nanoparticles and the energy level of the light-emitting layer is prevented.

DESCRIPTION OF DRAWINGS

In order to describe the technical solutions in the embodiments of the present disclosure more clearly, the following briefly describes the accompanying drawings required for describing the embodiments. Apparently, the accompanying drawings in the following description show merely some embodiments of the present disclosure, and persons skilled in the art may still derive other drawings from these accompanying drawings.

DETAILED DESCRIPTION OF PREFERRED EMBODIMENTS

The technical solutions in the embodiments of the present disclosure are clearly and completely described in the following with reference to the accompanying drawings in the embodiments of the present disclosure. Obviously, the described embodiments are only part of the embodiments of the present disclosure, but are not all embodiments of the present disclosure. All other embodiments obtained by those skilled in the art based on the embodiments of the present disclosure without creative efforts are within the scope of the present disclosure.

In the description of the present disclosure, it is to be understood that the orientation or positional relationship indicated by the terms "height", "width", "thickness", "upper", "lower", "left", "right", "vertical", "horizontal", "inside", "outside", etc is based on the orientation or positional relationship shown in the accompanying figures, which is merely for the convenience for describing of the present disclosure and for the simplification of the description, and is not intended to indicate or imply that the indicated devices or elements have a specific orientation or is constructed and operated in a specific orientation. Therefore, it should not be understood as a limitation on the present disclosure. Moreover, the terms "first" and "second" are used for descriptive purposes only and are not to be understood as indicating or implying relative importance or implicitly indicating the number of the indicated technical characteristics. Therefore, the characteristics defined by "first" or "second" may include one or more of the described characteristics either explicitly or implicitly. In the description of the present disclosure, the meaning of "a plurality" is two or more unless clearly and specifically defined otherwise.

The present disclosure provides a display device and a manufacturing method of the display device, and they are described below respectively.

Figure 1:
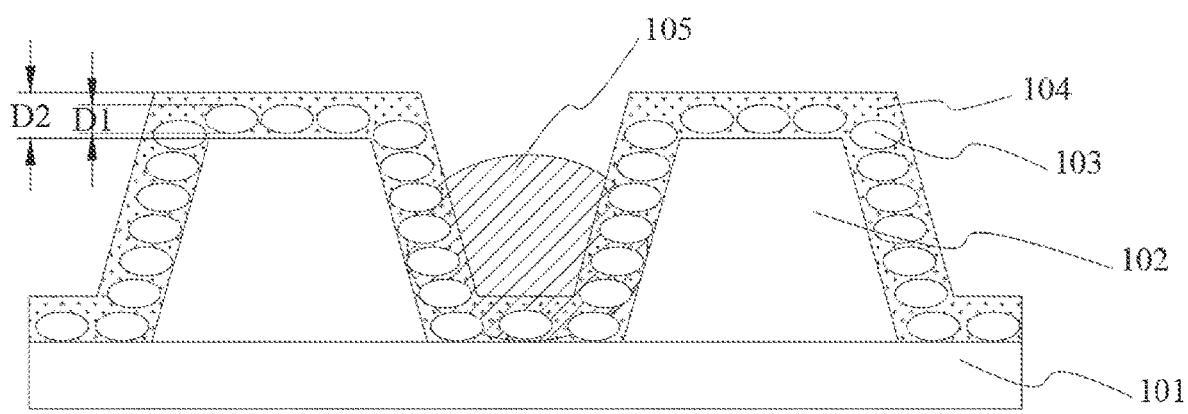
FIG. 1 is a structural schematic diagram of a display device in an embodiment of the present disclosure.

First, the present disclosure provides the display device. As illustrated in FIG. 1, FIG. 1 is a structural schematic diagram of a display device in an embodiment of the present disclosure. The display device includes a substrate 101, a pixel definition layer 102 disposed on the substrate 101 and having a plurality of pixel openings; a surface-active nanolayer 104 disposed on a surface of the substrate 101 and on a surface extending to the pixel definition layer 102, wherein the surface-active nanolayer 104 covers a plurality of nanoparticles 103; and a light-emitting layer 105 disposed in the plurality of pixel openings.

Compared to current display devices and current manufacturing method of the display devices, in the present disclosure, by disposing the surface-active nanolayer 104 covering the plurality of nanoparticles 103 on the surface of the substrate 101 and the surface extending to the pixel definition layer 102, when the light-emitting layer 105 is inkjet printed, the ink first contacts the nanoparticles 103 while dropping, and contact areas between the ink and the nanoparticles 103 become small. The ink disperses and flows down along the nanoparticles 103, and then diffuses evenly in the openings of the pixel definition layer 102. Therefore, the ink can cover corner locations on bottom sections of the openings, and infiltration of the ink can be improved, thereby the color blend phenomenon between the adjacent pixel units is able to improve. Meanwhile, after the surface-active nanolayer 104 is diffused, flatness of a top surface thereof is far flatter than the nanoparticles 103. The energy level of the surface-active nanolayer 104 matches the energy level of the light-emitting layer 105, which further improves uniformity of the light-emitting layer 105, and the unevenness on the top surfaces of the nanoparticles 105 resulting in electrons and electron holes being trapped in advance and being not able to reach the light-emitting layer 105 to emit light incurred by unevenness on the top surfaces of the nanoparticles 103 is prevented. Also, difficulty of transmission on electron hole carriers and electron carriers incurred by inconsistency between the energy level of the nanoparticles 103 and the energy level of the light-emitting layer 105 is prevented.

In the aforesaid embodiment, the surface-active nanolayer 104 includes a plurality of discontinuous nanoparticles 103. A material of the nanoparticles 103 includes a conductive metal or conductive macromolecules, and the conductive metal includes gold nanoparticles or silver nanoparticles. Because contact properties between the substrate 101 and the ink of the inkjet printing is poor, the contact properties between the ink and the substrate 101 is changed by depositing a layer of the nanoparticles 103 on a surface of the substrate 101 and a surface of the pixel definition layer 102 in advance in this embodiment. Then, the contact angle between the ink and the substrate 101 becomes small, and electric charges transmit successfully in the substrate 101 and in the light-emitting layer 105 formed from the ink. The surface-active nanolayer 104 includes a plurality of nanoparticles 103. The adjacent two nanoparticles 103 are spaced apart at a certain interval; that is, they are diffused discontinuously, which prevents from slow flowing speed that results in the ink on a bottom layer less than the ink on a top layer when the ink flows down along the nanoparticles 103 during inkjet printing. Therefore, discontinuous distribution is conducive to the ink flowing down with appropriate speed. In several embodiments, the adjacent two nanoparticles 103 are spaced apart at a same interval. The plurality of nanoparticles 103 are evenly diffused on the surface of the substrate 101 and on the surface extending to the pixel definition layer 102. In some other embodiments, the adjacent two nanoparticles 103 are spaced apart at different intervals. The nanoparticles 103 also have conductivity. A material of the nanoparticles 103 includes a conductive metal or conductive macromolecules. Preferably, the nanoparticles 103 are conductive metals. The conductive metals include copper nanoparticles, palladium nanoparticles, nickel nanoparticles, silver nanoparticles, or gold nanoparticles. Preferably, the nanoparticles 103 are silver nanoparticles, or gold nanoparticles. Preferably, the substrate 101 is an array substrate.

Because the nanoparticles 103 have high surface energy, the particles are prone to aggregating. Furthermore, metal nanoparticles such as copper nanoparticles have poor antioxidant properties. In order to maintain performance of the metal nanoparticles, organic cover is usually needed to perform on surfaces of the metal nanoparticles. In this embodiment, the surface-active nanolayer 104 is disposed on the surface of the substrate 101 and on the surface extending to the pixel definition layer 102, and the surface-active nanolayer 104 covers the nanoparticles 103. The surface-active nanolayer 104 and the nanoparticles 103 are both distributed on the substrate 101 and do not contact with the surface of the pixel definition layer 102 and obliquely lateral surfaces and a top surface of the pixel definition layer 102. Furthermore, a material of the surface-active nanolayer 104 includes poly(3,4-ethylenedioxythiophene) and polystyrene sulfonate (PEDOT:PSS), a ratio of the poly(3,4-ethylenedioxythiophene) to the polystyrene sulfonate ranges from 1:5 to 8:1, and a mass fraction of the poly(3,4-ethylenedioxythiophene) ranges from 25% to 40%. A material not affecting properties of the substrate 101 and the pixel definition layer 102 and with good infiltration corresponding to the ink should be selected for the surface-active nanolayer 104; for example, indium tin oxide (ITO), poly(3,4-ethylenedioxythiophene):polystyrene sulfonate (PEDOT:PSS), poly(vinyl alcohol) (PVA), or polyvinylpyrrolidone (PVP), and preferably, poly(3,4-ethylenedioxythiophene):polystyrene sulfonate (PEDOT:PSS) is selected. The poly(3,4-ethylenedioxythiophene):polystyrene sulfonate can further act as a buffer layer to improve adhesion of the light-emitting layer 105, and the ink can be diffused better on the poly(3,4-ethylenedioxythiophene):polystyrene sulfonate.

It should be noted that a maximum height of the nanoparticles 103 is less than a thickness of the surface-active nanolayer 104. As illustrated in FIG. 1, the maximum height of the nanoparticles 103 is D1, and the thickness of the surface-active nanolayer 104 is D2. In order to make the surface-active nanolayer 104 can fully cover the nanoparticles 103, the top surfaces of the surface-active nanolayers 104 needs to be higher than the nanoparticles 103, so that the thickness of the surface-active nanolayer 104 is greater than the maximum height of the nanoparticles 103, that is, D1<D2. Preferably, the maximum height D1 of the nanoparticles 103 ranges from 20 nm to 50 nm, and the thickness D2 of the surface-active nanolayer ranges from 20 nm to 80 nm.

On the basis of the aforesaid embodiments, the energy level of the surface-active nanolayer 104 matches the energy level of the light-emitting layer 105. In part of the embodiments, the energy level of the light-emitting layer 105 and the energy level of the nanoparticles 103 are quite different and cannot be matched. Therefore, energy level structures between the substrates 101 and the light-emitting layer 105 should be optimized. The energy level of the surface-active nanolayer 104 matches the light-emitting layer 105, and the surface-active nanolayer 104 is used to construct an electron hole injection transmission system with gradient. The light-emitting layer 105 usually includes part or all of a hole injection layer, a hole transport layer, an organic light-emitting material layer, an electron transport layer, and an electron injection layer. The light-emitting layer 105 and an anode on the substrate 101 have appropriate energy level gradients. However, in this embodiment, the nanoparticles 103 and the surface-active nanolayer 104 are added between the anode and the light-emitting layer 105. Therefore, the surface-active nanolayer 104 with an appropriate energy level should be selected to prevent from free electron hole carriers being not able to transmit successfully incurred by the energy level gradient being destroyed.

In order to better manufacture the display device of the embodiments of the present disclosure, on the basis of the display device, embodiments of the present disclosure further provide a manufacturing method of the display device. The manufacturing method is used for manufacturing the display device of the aforesaid embodiments.

Figure 2:
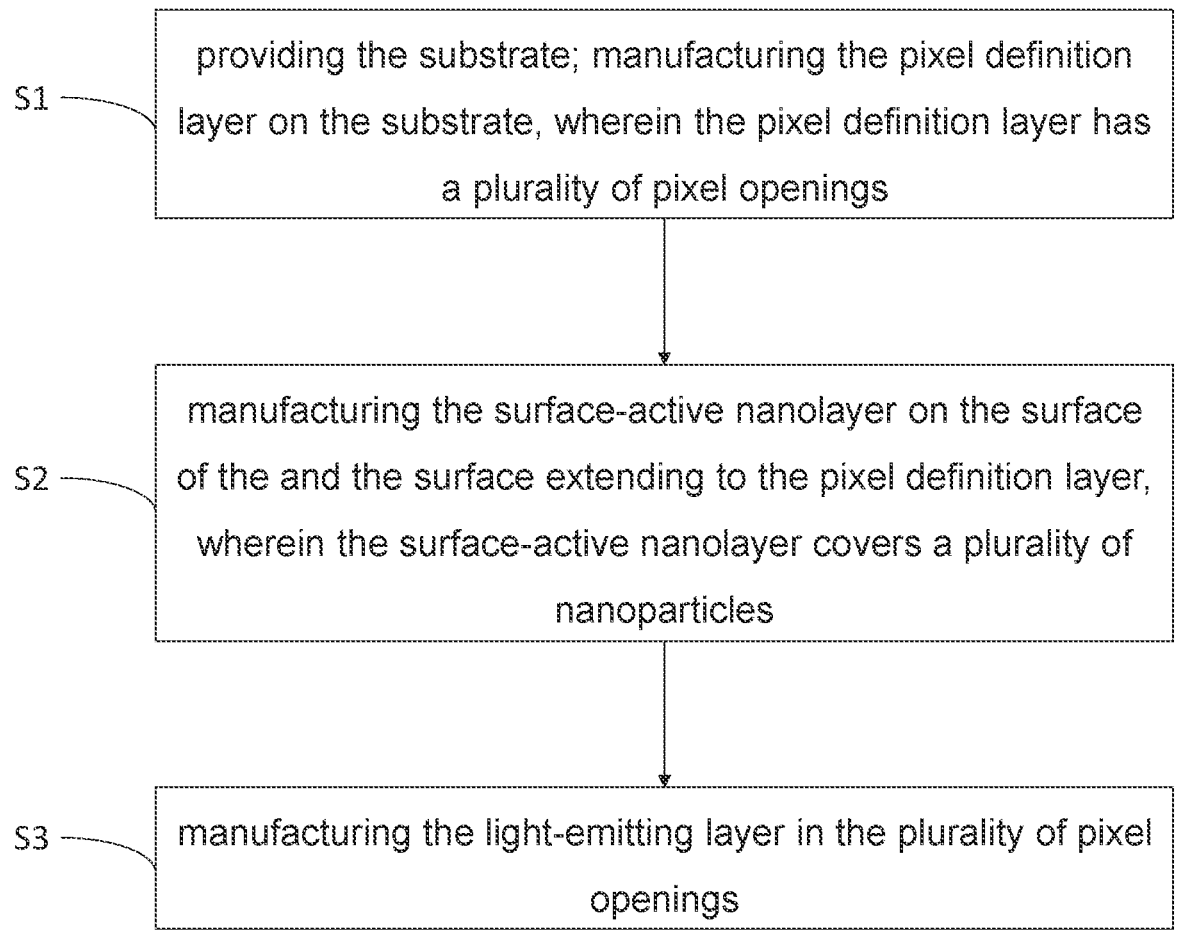
FIG. 2 is a flowchart of a manufacturing method in an embodiment of the present disclosure.
Figure 3A:
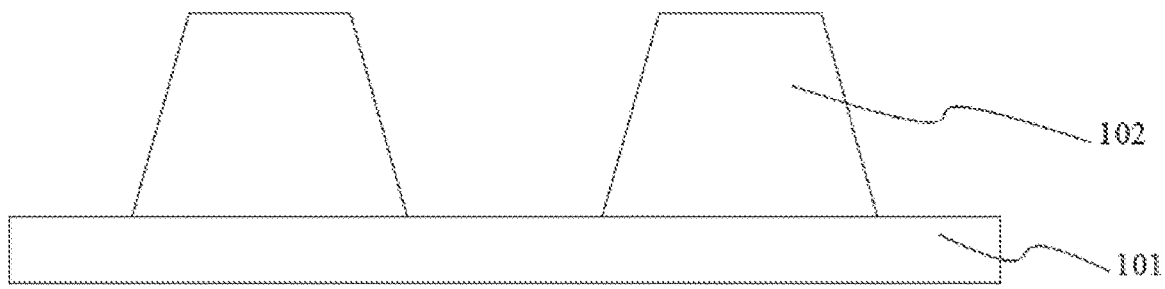
FIGS. 3A-3C are schematic diagrams of substeps of the manufacturing method of an embodiment of the present disclosure.
Figure 3B:
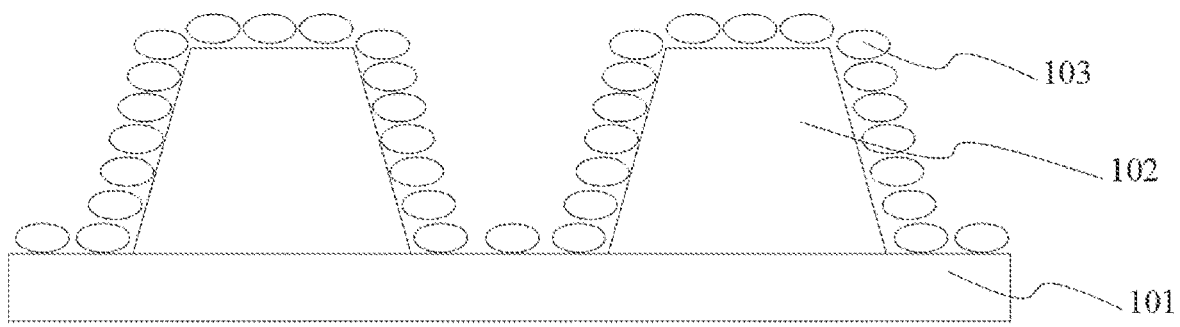
Figure 3C:
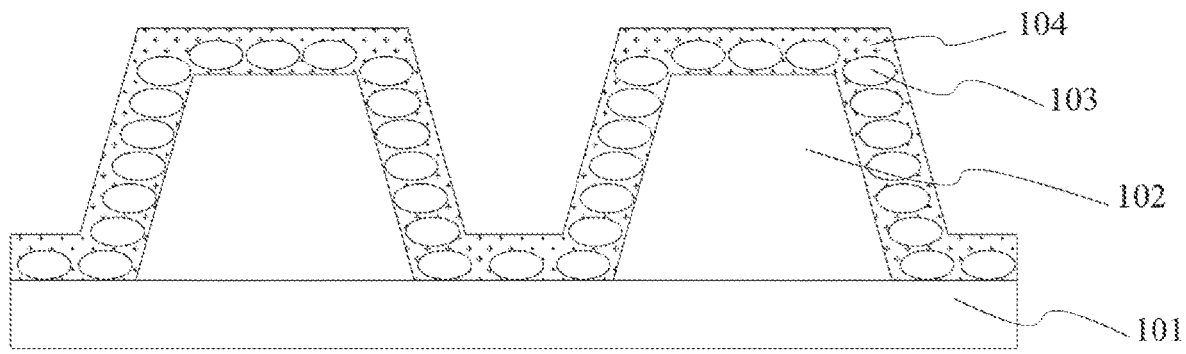

As illustrated in FIG. 2 and FIGS. 3A-3C, wherein FIG. 2 is a flow chart of an embodiment of a manufacturing method of embodiments of the present disclosure, and FIGS. 3A-3C are schematic diagrams of substeps of the manufacturing method of an embodiment of the present disclosure. The manufacturing method of the display device includes following steps.

S1, providing the substrate 101; manufacturing the pixel definition layer 102 on the substrate 101, wherein the pixel definition layer 102 has a plurality of pixel openings.

Specifically, in this embodiment, the substrate 101 is an array substrate. A plurality of anodes are manufactured on a surface of the array substrate (not shown in figure). As illustrated in FIG. 3A, the pixel definition layer 102 is manufactured on the surface of the array substrate, the pixel definition layer 102 includes a plurality of walls, the walls are disposed between gaps of adjacent anodes, and the plurality of walls form a plurality of openings.

S2, manufacturing the surface-active nanolayer 104 on the surface of the substrate 101 and the surface extending to the pixel definition layer 102, wherein the surface-active nanolayer 104 covers a plurality of nanoparticles 103.

Specifically, a spin coating method, a coating method, a printing method, or an evaporation method is used for manufacturing the surface-active nanolayer 104. After the surface-active nanolayer 104 is manufactured, performing a plasma process, an ozone process, etc. on the surface-active nanolayer 104 can be further included, which are able to further improves surface activity and eliminate foreign matters that might appear on a surface of the layer.

It is worth mentioning that manufacturing the surface-active nanolayer 104 can be divided into two steps; that is, the nanoparticles 103 and a surface-active agent are manufactured on the surface of the substrate 101 and the surface extending to the pixel definition layer 102 sequentially; or the nanoparticles 103 and the surface-active agent can be manufactured on the surface of the substrate 101 and the surface extending to the pixel definition layer 102 at a same time, which are described as the following.

Manufacturing the surface-active nanolayer 104 with two steps includes manufacturing a first solution mixed with nanoparticles 103; spin coating, coating, printing, or evaporating the first solution on the surface of the substrate 101 and the surface extending to the pixel definition layer 102; and drying and baking the first solution to remove a solvent of the first solution to obtain the plurality of nanoparticles 103 as illustrated in FIG. 3B; manufacturing a second solution mixed with a surface-active agent; spin coating, coating, printing, or evaporating the second solution on the surface of the substrate 101 and the surface extending to the pixel definition layer 102; drying and baking the second solution to remove a solvent of the second solution to obtain the surface-active nanolayer 104, wherein the surface-active nanolayer 104 covers the plurality of nanoparticles 103 as illustrated in FIG. 3 C.

Furthermore, the maximum height of the nanoparticles 103 formed after drying and curing ranges from 20 nm to 50 nm. The plurality of nanoparticles 103 are discontinuous. Preferably, the nanoparticles 103 are gold nanoparticles or silver nanoparticles. The thickness of the surface-active nanolayer 104 formed after drying and curing ranges from 20 nm to 80 nm. In the same embodiment, the thickness of the surface-active nanolayer 104 is greater than the maximum height of the nanoparticles 103. Preferably, the surface-active nanolayer 104 is poly(3,4-ethylenedioxythiophene): polystyrene sulfonate.

Manufacturing the surface-active nanolayer 104 by one step includes manufacturing a third solution mixed with nanoparticles and a surface-active agent 103; spin coating, coating, printing, or evaporating the third solution on the surface of the substrate and the surface extending to the pixel definition layer; drying and baking the third solution to remove a solvent of the third solution to obtain the surface-active nanolayer 104, wherein the surface-active nanolayer 104 covers the plurality of nanoparticles as illustrated in FIG. 3C.

It can be understood that in the one-step method, the height of the nanoparticles 103 in the surface-active nanolayer 104 particularly needs to be noted. The top surface of the surface-active nanolayer 104 should cover the nanoparticles 103 all the time. The third solution is actually a mixing solution of the first solution and the second solution, so manufacturing processes, environments, and properties are similar to the two-step method, and contents of each solute and solvent can be adjusted appropriately.

S3, manufacturing the light-emitting layer 105 in the plurality of pixel openings.

Specifically, as illustrated in FIG. 1, a printing method or an evaporation method are used for manufacturing the light-emitting layer 105.

In the embodiments mentioned above, the descriptions to the various embodiments are emphasized, and the part is not described in detailed in an embodiment, can refer to the detailed description of other embodiments mentioned above, and will not give unnecessary details herein. During a specific implementation, the various units or structures mentioned above may be implemented as a separate entity, or may be implemented in any combination, as the same or several entities. For the specific implementation of the various units or structures mentioned above, can refer to the method embodiments mentioned above, and will not give unnecessary details herein.

The above describes the embodiments of the present disclosure in detail. This article uses specific cases for describing the principles and the embodiments of the present disclosure, and the description of the embodiments mentioned above is only for helping to understand the method and the core idea of the present disclosure. Meanwhile, for those skilled in the art, will have various changes in specific embodiments and application scopes according to the idea of the present disclosure. In summary, the content of the specification should not be understood as limit to the present disclosure.

What is claimed is:

1. A display device, comprising:
a substrate;
a pixel definition layer disposed on the substrate and having a plurality of pixel openings;
a surface-active nanolayer disposed on a surface of the substrate and on a surface extending to the pixel definition layer, wherein the surface-active nanolayer covers a plurality of nanoparticles; and
a light-emitting layer disposed in the plurality of pixel openings.

2. The display device as claimed in claim 1, wherein the surface-active nanolayer comprises a plurality of discontinuous nanoparticles, a material of the nanoparticles comprises a conductive metal or conductive macromolecules, and the conductive metal comprises gold nanoparticles or silver nanoparticles.

3. The display device as claimed in claim 1, wherein a material of the surface-active nanolayer comprises poly(3,4-ethylenedioxythiophene) and polystyrene sulfonate, a ratio of the poly(3,4-ethylenedioxythiophene) to the polystyrene sulfonate ranges from 1:5 to 8:1, and a mass fraction of the poly(3,4-ethylenedioxythiophene) ranges from 25% to 40%.

4. The display device as claimed in claim 1, wherein a maximum height of the nanoparticles is less than a thickness of the surface-active nanolayer.

5. The display device as claimed in claim 1, wherein a maximum height of the nanoparticles ranges from 20 nm to 50 nm, and a thickness of the surface-active nanolayer ranges from 20 nm to 80 nm.

6. The display device as claimed in claim 1, wherein an energy level of the surface-active nanolayer matches an energy level of the light-emitting layer.

7. The display device as claimed in claim 1, wherein a surface of the surface-active nanolayer away from the substrate is smooth.

8. The display device as claimed in claim 1, wherein a plurality of anodes are disposed on the surface of the substrate, the pixel definition layer comprises a plurality of walls, and each of the walls is disposed between a gap of two adjacent anodes.

9. A manufacturing method of a display device, comprising:
providing a substrate; manufacturing a pixel definition layer on the substrate, wherein the pixel definition layer has a plurality of pixel openings;
manufacturing a surface-active nanolayer on a surface of the substrate and a surface extending to the pixel definition layer, wherein the surface-active nanolayer covers a plurality of nanoparticles; and
manufacturing a light-emitting layer in the plurality of pixel openings to obtain the display device.

10. The manufacturing method as claimed in claim 9, wherein a spin coating method, a coating method, a printing method, or an evaporation method is used for manufacturing the surface-active nanolayer, and the printing method, or the evaporation method is used for manufacturing the light-emitting layer.

11. The manufacturing method as claimed in claim 9, wherein manufacturing the surface-active nanolayer comprises:
manufacturing a first solution mixed with nanoparticles;
spin coating the first solution on the surface of the substrate and the surface extending to the pixel definition layer;
drying and baking the first solution to remove a solvent of the first solution to obtain the plurality of nanoparticles;
manufacturing a second solution mixed with a surface-active agent;
spin coating the second solution on the surface of the substrate and the surface extending to the pixel definition layer; and
drying and baking the second solution to remove a solvent of the second solution to obtain the surface-active nanolayer, wherein the surface-active nanolayer covers the plurality of nanoparticles.

12. The manufacturing method as claimed in claim 9, wherein manufacturing the surface-active nanolayer comprises:
manufacturing a third solution mixed with nanoparticles and a surface-active agent;
spin coating the third solution on the surface of the substrate and the surface extending to the pixel definition layer;
drying and baking the third solution to remove a solvent of the third solution to obtain the surface-active nanolayer, wherein the surface-active nanolayer covers the plurality of nanoparticles.

13. The manufacturing method as claimed in claim 9, wherein the surface-active nanolayer comprises a plurality of discontinuous nanoparticles.

14. The manufacturing method as claimed in claim 9, wherein a material of manufacturing the nanoparticles comprises a conductive metal or conductive macromolecules, and the conductive metal comprises gold nanoparticles or silver nanoparticles.

15. The manufacturing method as claimed in claim 9, wherein a material of manufacturing the surface-active nanolayer comprises poly(3,4-ethylenedioxythiophene) and polystyrene sulfonate, a ratio of the poly(3,4-ethylenedioxythiophene) to the polystyrene sulfonate ranges from 1:5 to 8:1, and a mass fraction of the poly(3,4-ethylenedioxythiophene) ranges from 25% to 40%.

16. The manufacturing method as claimed in claim 9, wherein a maximum height of the nanoparticles is less than a thickness of the surface-active nanolayer.

17. The manufacturing method as claimed in claim 9, wherein a maximum height of the nanoparticles ranges from 20 nm to 50 nm, and a thickness of the surface-active nanolayer ranges from 20 nm to 80 nm.

18. The manufacturing method as claimed in claim 9, wherein an energy level of a material of manufacturing the surface-active nanolayer matches an energy level of a material of manufacturing the light-emitting layer.

19. The manufacturing method as claimed in claim 9, wherein manufacturing the surface-active nanolayer comprises performing a planarizing process on a surface of the surface-active nanolayer away from the substrate.

20. The manufacturing method as claimed in claim 9, wherein the manufacturing method comprises manufacturing a plurality of anodes on the surface of the substrate, the pixel definition layer comprises a plurality of walls, and each of the walls is disposed between a gap of two adjacent anodes.

* * * * *